(12) United States Patent
Lu et al.

(10) Patent No.: US 12,635,387 B2
(45) Date of Patent: May 19, 2026

(54) DISPLAY SUBSTRATE, FABRICATION METHOD THEREOF, DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Shan Lu, Beijing (CN); Ruiqi Xiu, Beijing (CN); Jiang Liu, Beijing (CN); Dawei Wang, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 786 days.

(21) Appl. No.: 17/913,223

(22) PCT Filed: Oct. 26, 2021

(86) PCT No.: PCT/CN2021/126264
§ 371 (c)(1),
(2) Date: Sep. 21, 2022

(87) PCT Pub. No.: WO2022/205865
PCT Pub. Date: Oct. 6, 2022

(65) Prior Publication Data
US 2024/0224717 A1 Jul. 4, 2024

(30) Foreign Application Priority Data
Mar. 29, 2021 (CN) .......................... 202110335504.9

(51) Int. Cl.
*H10K 59/80* (2023.01)
*H10K 71/13* (2023.01)

(52) U.S. Cl.
CPC ......... *H10K 59/873* (2023.02); *H10K 71/135* (2023.02)

(58) Field of Classification Search
None
See application file for complete search history.

(56) References Cited

U.S. PATENT DOCUMENTS

| | | | | |
|---|---|---|---|---|
| 2019/0131562 A1* | 5/2019 | Rhe | ......................... | H10D 86/60 |
| 2020/0185647 A1* | 6/2020 | Lee | ..................... | G09G 3/3283 |
| 2020/0194534 A1* | 6/2020 | Park | ................... | H10K 50/8426 |

FOREIGN PATENT DOCUMENTS

| | | |
|---|---|---|
| CN | 108832022 A | 11/2018 |
| CN | 109065743 A | 12/2018 |

(Continued)

*Primary Examiner* — Kyoung Lee
(74) *Attorney, Agent, or Firm* — HOUTTEMAN LAW LLC

(57) ABSTRACT

Embodiments of the present disclosure provide a display substrate, a fabrication method thereof, a display panel and a display device. The display substrate includes: a driver circuit board including a plurality of functional film layers; and a planarization layer on the driver circuit board. The display substrate further includes a display region and a first edge region. The first edge region surrounds a periphery of the display region. Part of the functional film layers extends from the display region to the first edge region. The planarization layer extends from the display region to an area of the first edge region that borders the display region. The display substrate includes a flow guide structure disposed on a side of the planarization layer facing away from the driver circuit board, and on at least one side of a boundary of the planarization layer.

18 Claims, 7 Drawing Sheets

(56)          References Cited

FOREIGN PATENT DOCUMENTS

| CN | 109524562 A | 3/2019 |
| CN | 113078173 A | 7/2021 |

* cited by examiner

A-A

DISPLAY SUBSTRATE, FABRICATION METHOD THEREOF, DISPLAY PANEL AND DISPLAY DEVICE

CROSS-REFERENCE TO RELATED APPLICATION

This is a National Phase Application filed under 35 U.S.C. 371 as a national stage of PCT/CN2021/126264, filed on Oct. 26, 2021, an application claiming the benefit of priority to Chinese Patent Application No. 202110335504.9 filed to the National Intellectual Property Administration of P R China on Mar. 29, 2021, the contents of which are incorporated herein in their entirety by reference

TECHNICAL FIELD

Embodiments of the present disclosure belong to the field of display technology, and specifically relates to a display substrate, a fabrication method thereof, a display panel and a display device.

BACKGROUND

With the continuous development of the organic light-emitting diode (OLED) display technology, the packaging requirement for OLED display products becomes higher and higher.

In the packaging process of an OLED display product, an organic packaging layer is typically adopted to package a light-emitting element in a display region of an OLED display substrate, and the organic packaging layer is formed through an inkjet printing (IJP) process so that the organic packaging layer can be thicker and the packaged display region tends to be flatter. However, at the periphery of the display region, since the coverage of the film layers corresponding to this region on the OLED display substrate is not uniform, and an organic packaging layer material ink will not be printed in this region when the organic packaging layer is formed through the IJP process, non-uniform levelling or even missing of the organic packaging layer material ink at the periphery of the display region or the like may occur, making it difficult to achieve good planarization at the periphery of the display region after packaging, and finally causing package failure of the subsequently formed inorganic packaging layer at the periphery of the display region, or short circuit or open circuit or other defects in the touch electrode film layer subsequently formed above the organic packaging layer at the periphery of the display region, thereby affecting performance of the OLED display product.

SUMMARY

Embodiments of the present disclosure provide a display substrate, a fabrication method thereof, a display panel and a display device.

In a first aspect, an embodiment of the present disclosure provides a display substrate, including: a driver circuit board including a plurality of functional film layers; and a planarization layer on the driver circuit board. The display substrate further includes a display region and a first edge region surrounding a periphery of the display region; part of the functional film layers extends from the display region to the first edge region; and the planarization layer extends from the display region to an area of the first edge region that borders the display region. The display substrate further includes a flow guide structure on a side of the planarization layer facing away from the driver circuit board, and on at least one side of a boundary of the planarization layer.

In some embodiments, the flow guide structure includes a plurality of convex parts arranged at intervals along the boundary of the planarization layer.

In some embodiments, the plurality of convex parts are arranged at equal intervals along the boundary of the planarization layer.

In some embodiments, an interval between adjacent convex parts ranges from 300 μm to 400 μm; and a maximum radial size of an orthographic projection of the convex part on the planarization layer ranges from 15 μm to 30 μm.

In some embodiments, a shape of the convex part includes a prismatic shape, a cylindrical shape, a frustum shape, or a prismoid shape, and a central axis of each convex part is perpendicular to a plane where the planarization layer is located.

In some embodiments, the flow guide structure includes a plurality of concave parts disposed in the planarization layer and arranged at intervals along the boundary of the planarization layer.

In some embodiments, the plurality of concave parts are arranged at equal intervals along the boundary of the planarization layer.

In some embodiments, an interval between adjacent concave parts ranges from 300 μm to 400 μm; and a maximum size of the concave parts in a direction perpendicular to an extending direction of an orthographic projection of the concave part on the planarization layer ranges from 15 μm to 30 μm.

In some embodiments, a depth of the concave part is less than a thickness of the planarization layer.

In some embodiments, the concave parts include bar-shaped grooves or recessed holes; a length direction of the bar-shaped groove forms an angle greater than 0° and less than or equal to 90° relative to an extending direction of the boundary of the planarization layer where the bar-shaped grooves are located; and a shape of an orthographic projection of the recessed hole on the planarization layer includes a circular shape, an elliptical shape, a fan shape, a rectangular shape, a polygonal shape or an irregular shape.

In some embodiments, the display substrate further includes a second edge region surrounding a periphery of the first edge region. The driver circuit board further includes a plurality of insulating film layers extending from the display region to the first edge region and the second edge region; and in the second edge region, a dam surrounding the display region is formed in one or more of the insulating film layers adjacent to the planarization layer.

In a second aspect, an embodiment of the present disclosure further provides a display panel, including a light-emitting element and an organic packaging layer, as well as the display substrate as described above. The light-emitting element is disposed on a side of the planarization layer facing away from the driver circuit board in the display substrate, and in the display region of the display substrate; the organic packaging layer is disposed on a side of the light-emitting element facing away from the planarization layer to package the light-emitting element; and the organic packaging layer extends from the display region to cover the first edge region of the display substrate.

In some embodiments, a surface of the organic packaging layer facing away from the light-emitting element is a first surface; and a portion of the first surface in the display region is substantially flush with a portion of the first surface in the first edge region.

In some embodiments, the display substrate further includes a first inorganic packaging layer and a second inorganic packaging layer; the first inorganic packaging layer is located between the light-emitting element and the organic packaging layer; the second inorganic packaging layer is located on a side of the organic packaging layer facing away from the light-emitting element; and the first inorganic packaging layer and the second inorganic packaging layer cover the display region, the first edge region, and a second edge region of the display substrate.

In some embodiments, the display substrate further includes a touch electrode layer on a side of the second inorganic packaging layer facing away from the organic packaging layer; the touch electrode layer extends from the display region to the first edge region.

In a third aspect, an embodiment of the present disclosure further provides a display device including the display panel as described above.

In a fourth aspect, an embodiment of the present disclosure further provides a method for fabricating the display substrate as described above, including: fabricating a driver circuit board, including forming a plurality of functional film layers; and forming a planarization layer on the driver circuit board. The method further includes forming a flow guide structure on the planarization layer; and the flow guide structure is formed on at least one side of a boundary of the planarization layer on a side of the planarization layer facing away from the driver circuit board.

In some embodiments, forming the flow guide structure includes forming a convex part. Forming the convex part includes: coating a planarization layer material film on the planarization layer; and exposing and developing to form a pattern of the convex part. Or, forming the convex part includes: performing, during formation of the planarization layer, halftone exposure on a planarization layer material film formed by coating, such that a region corresponding to the pattern of the convex part is not exposed, a region corresponding to a pattern of the planarization layer other than the region corresponding to the pattern of the convex part is partially exposed, and regions other than the regions corresponding to the pattern of the convex part and the pattern of the planarization layer are completely exposed; and forming the pattern of the convex part and the pattern of the planarization layer simultaneously after development.

In some embodiments, forming the flow guide structure includes forming a concave part; and forming the concave part includes: performing, during formation of the planarization layer, halftone exposure on a planarization layer material film formed by coating, such that a region corresponding to a pattern of the concave part is partially exposed, a region corresponding to a pattern of the planarization layer other than the region corresponding to the pattern of the concave part is not exposed, and regions other than the region corresponding to the pattern of the planarization layer are completely exposed; and forming the pattern of the concave part and the pattern of the planarization layer simultaneously after development.

BRIEF DESCRIPTION OF DRAWINGS

Accompanying drawings are provided for further understanding of the embodiments of the present disclosure and constitute a part of the specification. Hereinafter, these drawings are intended to explain the present disclosure together with the following embodiments, but should not be considered as a limitation to the present disclosure. The above and other features and advantages will become more apparent to those skilled in the art by describing in detail exemplary embodiments thereof with reference to the attached drawings, in which.

DETAIL DESCRIPTION OF EMBODIMENTS

Figure 1:
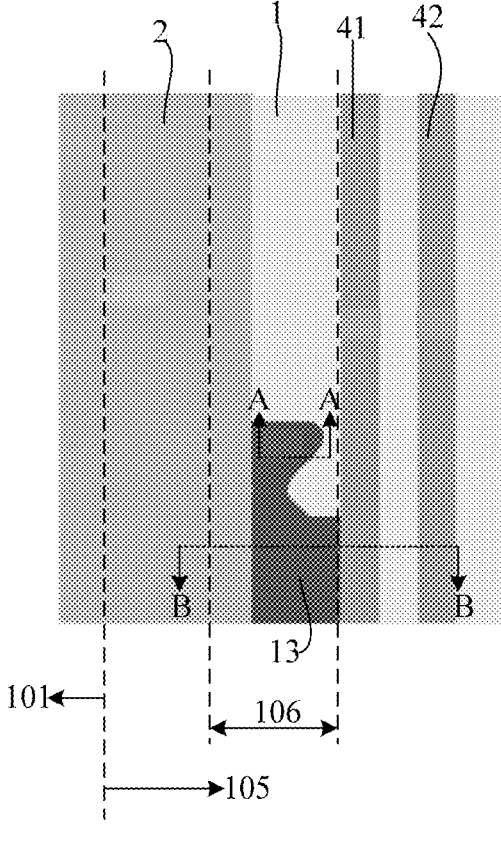
FIG. 1 is a schematic top view of a partial structure of a binding side edge region for binding a peripheral circuit in an existing OLED display substrate.

In order to make those skilled in the art better understand the technical solutions in the embodiments of the present disclosure, the display substrate, the fabrication method thereof, the display panel and the display device provided in the embodiments of the present disclosure will be described in further detail below with reference to the accompanying drawings and specific implementations.

Embodiments of the present disclosure will be described more sufficiently below with reference to the accompanying drawings, which may be embodied in different forms and should not be construed as being limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but further include modifications of configurations formed based on a manufacturing process. Thus, the regions illustrated in the figures have schematic properties, and the shapes of the regions shown in the figures illustrate specific shapes of regions, but are not intended to be limitative.

Figure 2:
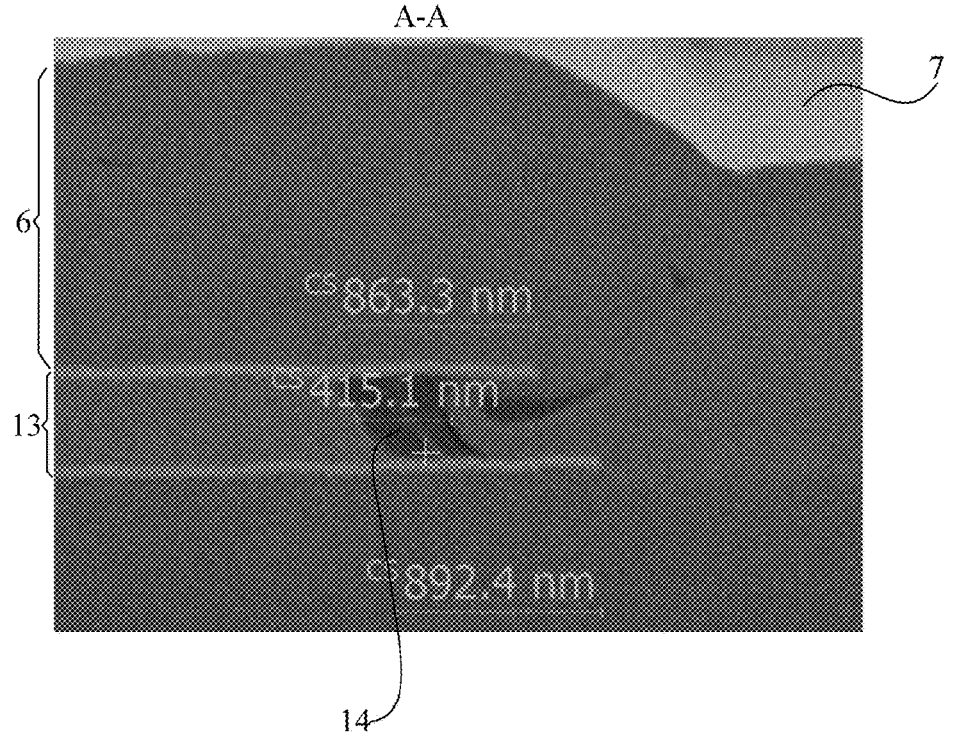
FIG. 2 is an electron micrograph taken along line AA in FIG. 1.
Figure 3:
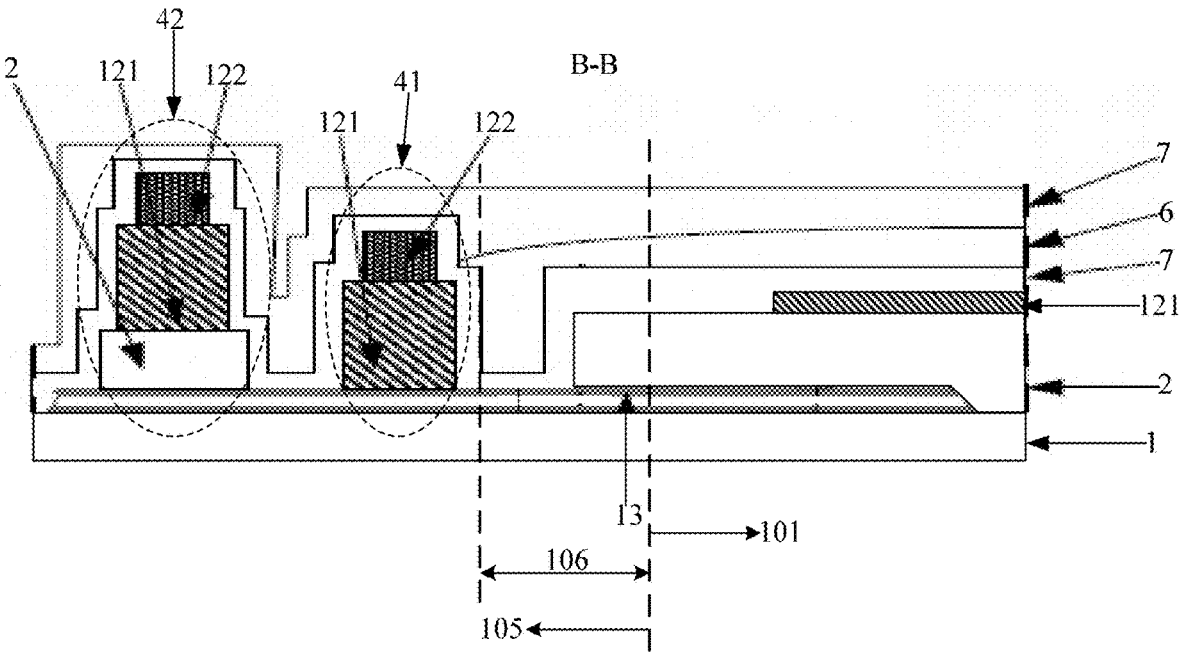
FIG. 3 is a schematic sectional view of a structure taken along line BB in FIG. 1.
Figure 4:
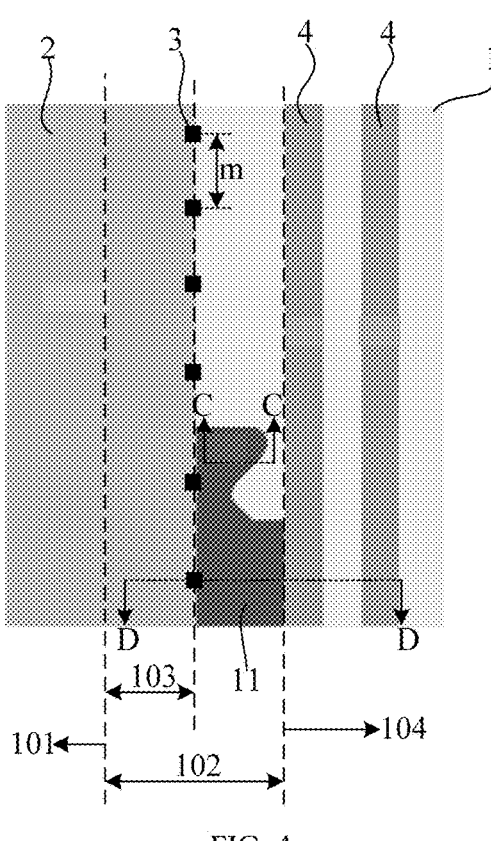
FIG. 4 is a schematic top view of a partial structure of an edge region of a display substrate according to an embodiment of the present disclosure.
Figure 5:
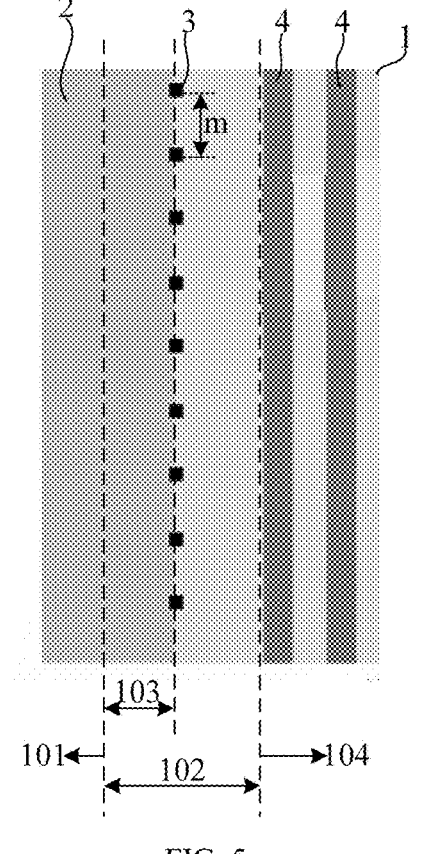
FIG. 5 is another schematic top view of a partial structure of an edge region of a display substrate according to an embodiment of the present disclosure.
Figure 6:
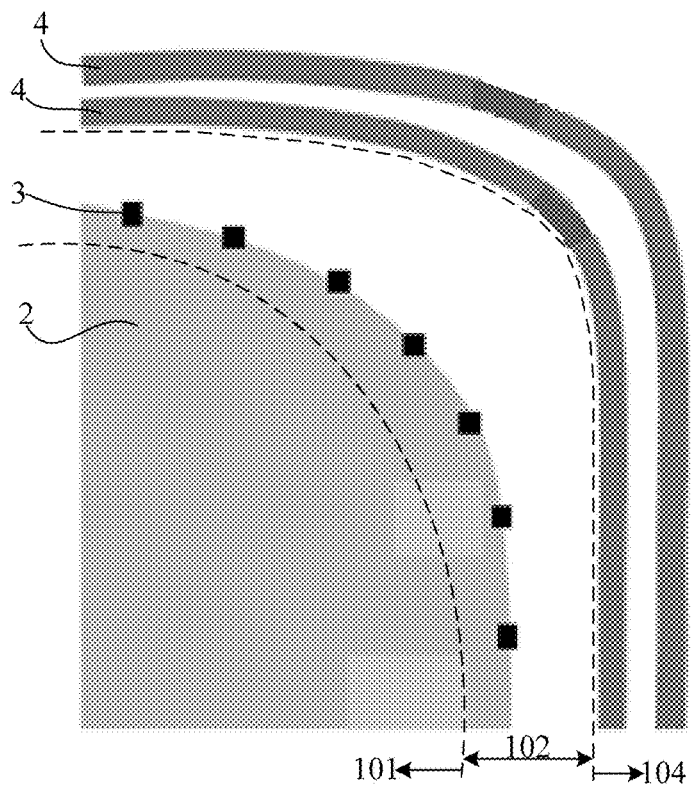
FIG. 6 is a schematic top view showing a partial structure at an angular position in an edge region of a display substrate according to an embodiment of the present disclosure.
Figure 7:
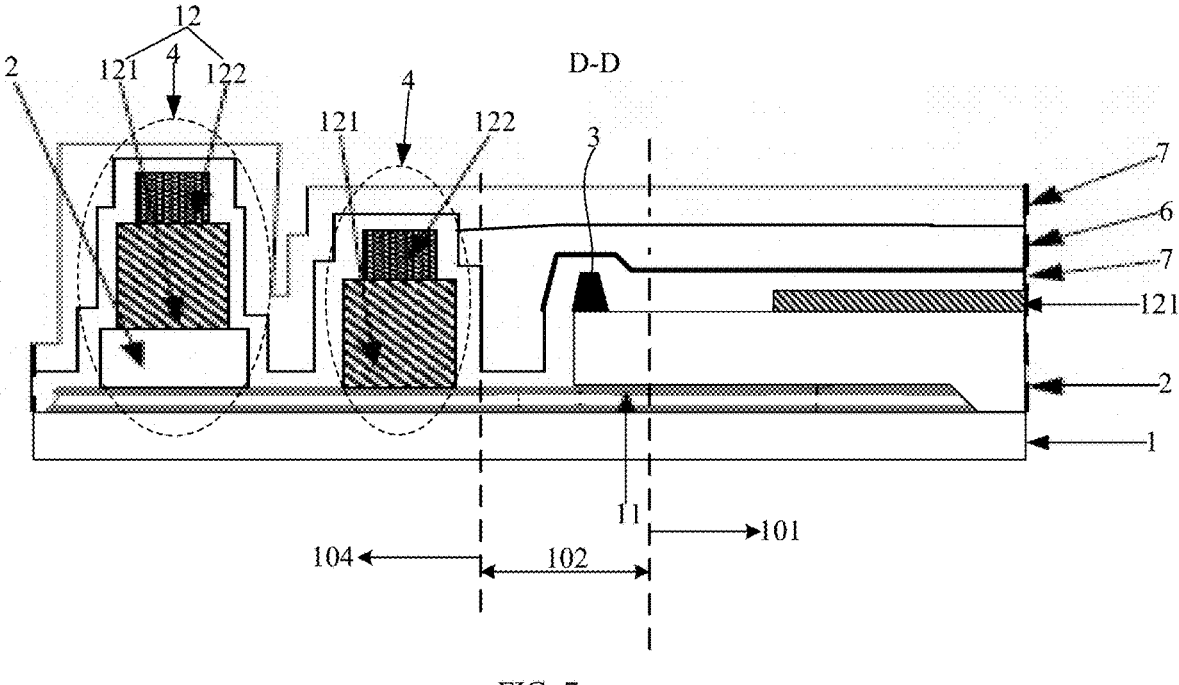
FIG. 7 is a schematic sectional view of a structure taken along line DD in FIG. 4.

Referring to FIGS. 1 to 3, a local arrangement of a binding side edge region for binding a peripheral circuit in an organic light-emitting diode (OLED) display substrate is shown, in which an edge region 105 of the OLED display substrate includes a driver circuit board 1, and a planarization layer 2, a pixel defining layer 121, a support spacer layer 122 and other film layers sequentially disposed on the driver circuit board 1. At an outer edge of the edge region 105 away from a display region 101, a dam surrounding a periphery of the display region 101 is formed by stacking the planarization layer 2, the pixel defining layer 121, and the support spacer layer 122. The dam includes a first dam 41 adjacent to the display region 101, and a second dam 42 surrounding a side of the first dam 41 away from the display region 101. The driver circuit board 1 includes a base, and a thin film transistor circuit on the base. Part of the functional film layers in the thin film transistor circuit further extends to the edge region 105 surrounding outside the display region 101. The functional film layers extending to the edge region 105 includes a conductive pattern for connecting to an anode of a light-emitting element, a conductive pattern for connecting to a high potential terminal (e.g., VDD) of the thin film transistor circuit, and a conductive pattern for connecting to a low potential terminal of the thin film transistor circuit (e.g., a VSS conductive pattern 13).

As can be seen from FIG. 1, in an inner edge region 106 between the first dam 41 and the display region 101, the VSS conductive pattern 13 is an irregular pattern with a notch, and merely part of the functional film layers in the thin film transistor circuit extend from the display region 101 to the inner edge region 106. Similar to the VSS conductive pattern 13, the functional film layers extending to the inner edge region 106 have different patterns, and do not completely cover the inner edge region 106, leading in an uneven surface of the inner edge region 106. Further, referring to FIG. 2, in the inner edge region 106, the VSS conductive pattern 13 tends to be over-etched during etching to form patterns of other functional film layers, forming a hole 14 on an edge end face.

Referring to FIG. 3, in order to ensure that the light-emitting element is formed on a relatively flat surface, the planarization layer 2 extends to merely cover a portion of the inner edge region 106 adjacent to the display region 101. Subsequently, in order to package the light-emitting element and ensure a flat package surface, the organic packaging layer 6 is printed on the display region 101 through an inkjet printing (IJP) process. The organic packaging layer 6 is usually printed merely on the region where the planarization layer 2 is located, and then, through the leveling property of the organic packaging layer material ink, the ink partially flows to the region of the inner edge region 106 not covered by the planarization layer 2. Since the region of the inner edge region 106 not covered by the planarization layer 2 has an uneven surface, the levelling of the organic packaging layer material ink in this region is uneven, and ink missing or other problems may occur, making it difficult to achieve good planarization in this region after packaging, and as a result, when a touch electrode film layer is formed over the packaging layer later, a corresponding touch electrode wire distributed in this region are prone to have a short circuit or open circuit.

Further, referring to FIG. 2, in order to prevent the light-emitting element from being corroded by external water and oxygen, the light-emitting element is usually further packaged with an inorganic packaging layer 7 which is configured to package the whole display region 101 and edge region 105. Since the inorganic packaging layer 7 is formed to be a relatively thin film, and the region of the inner edge region 106 not covered by the planarization layer 2 has an uneven surface, the inorganic packaging layer 7 packaging this region therefore has relatively poor compactness, so that the package with the inorganic packaging layer 7 can easily fail and make the light-emitting element vulnerable to corrosion of external water and oxygen, severely affecting the display performance of the light-emitting element.

To solve the above problem that the surface of the region not covered by the planarization layer in the inner edge region of the OLED display substrate is uneven, which is likely to cause package failure and poor circuit connection, an embodiment of the present disclosure provides a display substrate which, referring to FIGS. 4 to 7, includes: a driver circuit board 1 including a plurality of functional film layers 11; and a planarization layer 2 on the driver circuit board 1. The display substrate further includes a display region 101 and a first edge region 102. The first edge region 102 surrounds a periphery of the display region 101. Part of the functional film layers 11 extends from the display region 101 to the first edge region 102. The planarization layer 2 extends from the display region 101 to an area 103 (hereinafter also referred to as border edge region 10) of the first edge region 102 that borders the display region 101. A flow guide structure 3 is further provided, and the flow guide structure 3 is disposed on a side of the planarization layer 2 facing away from the driver circuit board 1, and on at least one side of a boundary of the planarization layer 2.

The driver circuit board 1 includes a thin film transistor circuit, and various signal lines (such as gate lines, data lines, enable control lines, and clock control lines) connected to the thin film transistor circuit. The functional film layers 11 include, for example, gate lines, data lines, enable control lines, clock control lines, a conductive pattern for connecting to a high potential terminal (e.g., VDD) of the thin film transistor circuit, and a conductive pattern for connecting to a low potential terminal (e.g., VSS) of the thin film transistor circuit, or the like. The functional film layers 11 extends from the display region 101 to the first edge region 102 include, for example, a conductive pattern for connecting to a high potential terminal (e.g., VDD) of the thin film transistor circuit, and a conductive pattern for connecting to a low potential terminal (e.g., VSS) of the thin film transistor circuit. Although part of the functional film layers 11 extends from the display region 101 to the first edge region 102, the functional film layers 11 in the first edge region 102 have different patterns, and do not completely cover the first edge region 102. Therefore, the surface of the display substrate in the first edge region 102 is not flat. The border edge region 103 of the first edge region 102 has an area smaller than the first edge region 102. That is, the planarization layer 2 covers merely the border edge region 103 of the first edge region 102, not the entire first edge region 102.

In some embodiments, the display substrate further includes a second edge region 104 surrounding a periphery of the first edge region 102. The driver circuit board 1 further includes a plurality of insulating film layers 12 extending from the display region 101 to the first edge region 102 and the second edge region 104. In the second edge region 104, a dam 4 surrounding the display region 101 is formed in one or more of the insulating film layers 12 adjacent to the planarization layer 2. Since substantially no functional film layer 11 in the driver circuit board 1 will extend to the second edge region 104, the surface of the display substrate in the second edge region 104 is substantially flat. The insulating film layers 12 include, for example, a pixel defining layer 121, a support spacer layer 122, and the like.

In some embodiments, two dams 4 are provided sequentially around the periphery of the display region 101, and can prevent ink overflowing when the organic packaging layer material ink is printed. One of the dams 4, which is adjacent to the display region 101, is formed by the pixel defining layer 121 and the support spacer layer 122 sequentially stacked; and the other of the dams 4, which is remote from the display region 101, is formed by a film layer of the same material and in the same layer as the planarization layer 2, the pixel defining layer 121, and the support spacer layer 122 sequentially stacked.

Figure 8:
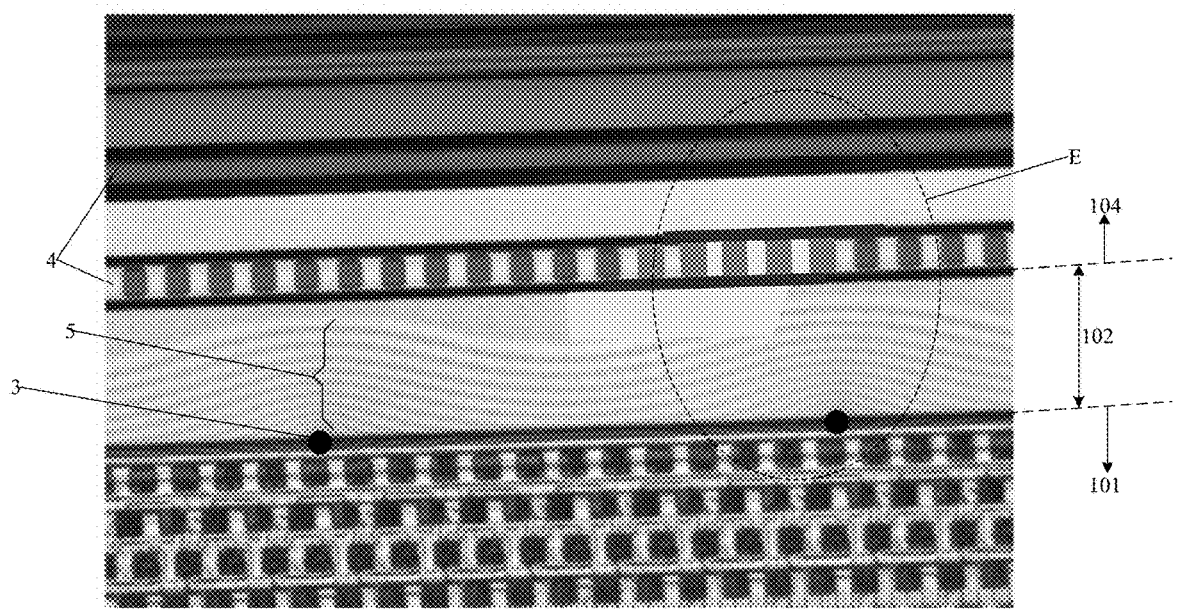
FIG. 8 is an enlarged view of a partial structure of the edge region of the display substrate in FIG. 5.
Figure 9:
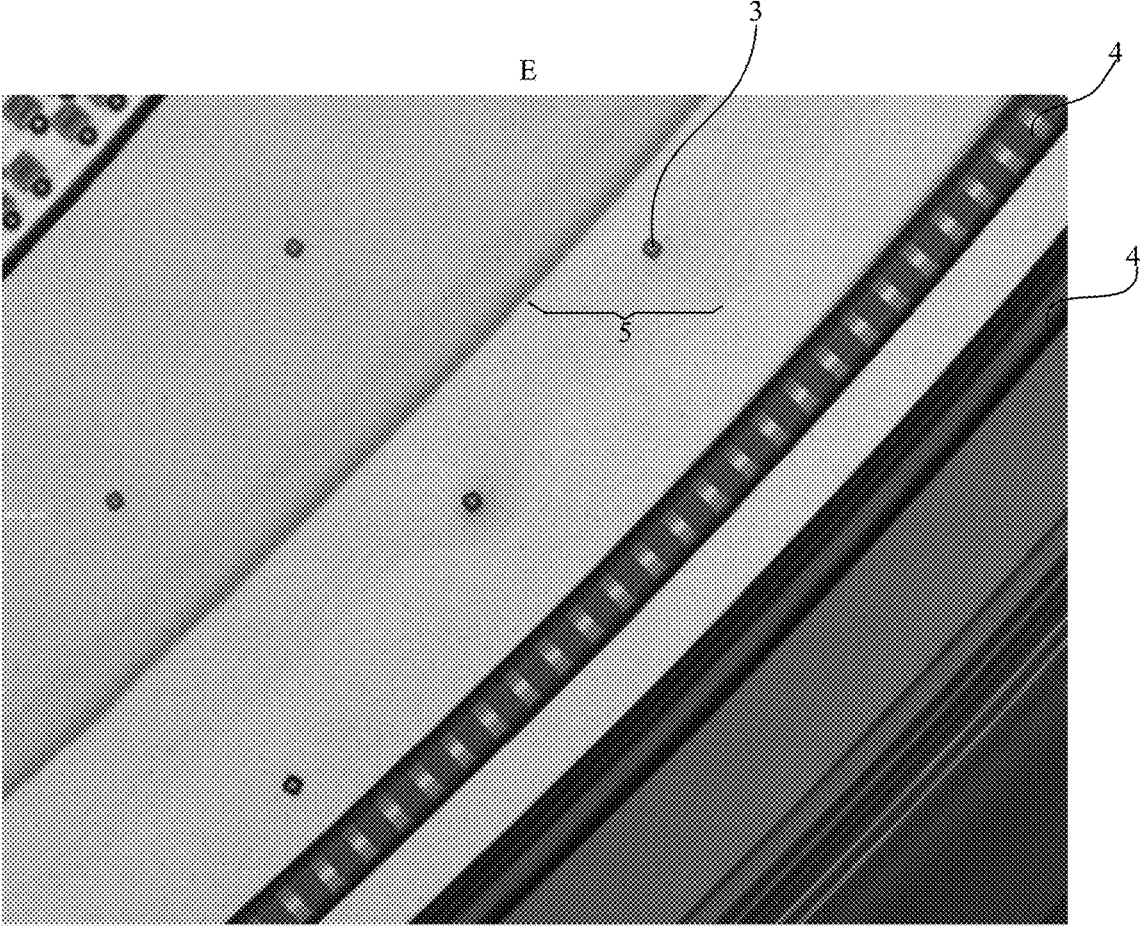
FIG. 9 is an enlarged view of portion E in FIG. 8.
Figure 10:
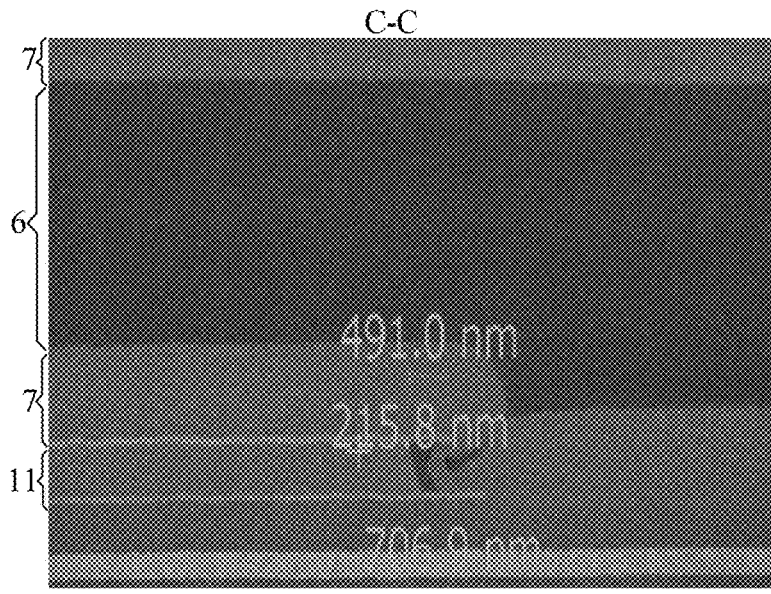
FIG. 10 is an electron micrograph taken along line CC in FIG. 4.

In this embodiment, referring to FIGS. 8 to 10, by providing the flow guide structure 3 on at least one side of the boundary of the planarization layer 2, when the organic packaging layer material ink 5 is printed in the display region 101 and the border edge region 103 later, the flow guide structure 3 can destroy a three-phase balance relationship between the organic packaging layer material ink 5 and the boundary of the planarization layer 2, and guide the organic packaging layer material ink 5 to a region in the first edge region 102 other than the border edge region 103, so that the organic packaging layer material ink 5 can be uniformly spread to the region in the first edge region 102 other than the border edge region 103 to further cover that region and fill holes in an edge end face of the conductive pattern (such as a VSS conductive pattern) in the first edge region 102. Therefore, the surface of the region in the first edge region 102 of the display substrate other than the border edge region 103 tends to be flat under the filling and leveling action of the organic packaging layer material ink 5. Therefore, it is ensured that the inorganic packaging layer 7 subsequently formed over the organic packaging layer 6 has good compactness, and the failure of the inorganic packaging layer 7 to package the light-emitting element is avoided. In addition, when a touch electrode film layer is formed over the packaging layer later, it is ensured that the touch electrode wire in the first edge region 102 is on a relatively flat surface, thereby avoiding defects such as short circuit or open circuit of the touch electrode wire correspondingly distributed in the first edge region 102.

In some embodiments, the flow guide structure 3 is located on the boundary of the planarization layer 2, which is the boundary of the planarization layer 2 on which the corresponding bonding region of the display substrate is located.

In some embodiments, the flow guide structure 3 is located on a peripheral boundary of the planarization layer 2.

In some embodiments, the flow guide structure 3 includes a plurality of convex parts arranged at intervals along the boundary of the planarization layer 2.

In some embodiments, the plurality of convex parts are arranged at equal intervals along the boundary of the planarization layer 2.

In some embodiments, it is also possible that the plurality of convex parts are not arranged at equal intervals along the boundary of the planarization layer 2.

In some embodiments, an interval m between adjacent convex parts ranges from 300 μm to 400 μm; and a maximum radial size of an orthographic projection of the convex parts on the planarization layer 2 ranges from 15 μm to 30 μm. The interval m between adjacent convex parts refers to a distance between centers of the adjacent convex parts.

In some embodiments, a shape of the convex part includes a prismatic shape, a cylindrical shape, a frustum shape, or a prismoid shape, and a central axis of each convex part is perpendicular to a plane where the planarization layer 2 is located. It should be noted that, depending on the manufacturing process, some shapes of the convex parts similar to those listed above (such as a shape with a rounded top corner or a shape with a top arc-shaped surface) are also within the protection scope of the present disclosure.

In some embodiments, the flow guide structure 3 includes a plurality of concave parts disposed in the planarization layer 2 and arranged at intervals along the boundary of the planarization layer 2.

In some embodiments, the plurality of concave parts are arranged at equal intervals along the boundary of the planarization layer 2.

In some embodiments, it is also possible that the plurality of concave parts are not arranged at equal intervals along the boundary of the planarization layer 2.

In some embodiments, an interval between adjacent concave parts ranges from 300 μm to 400 μm; and a maximum size of the concave parts in a direction perpendicular to an extending direction of an orthographic projection of the concave parts on the planarization layer 2 ranges from 15 μm to 30 μm. The interval between adjacent concave parts refers to a distance between centers of the adjacent concave parts.

In some embodiments, a depth of the concave parts is less than a thickness of the planarization layer 2.

Figure 11:
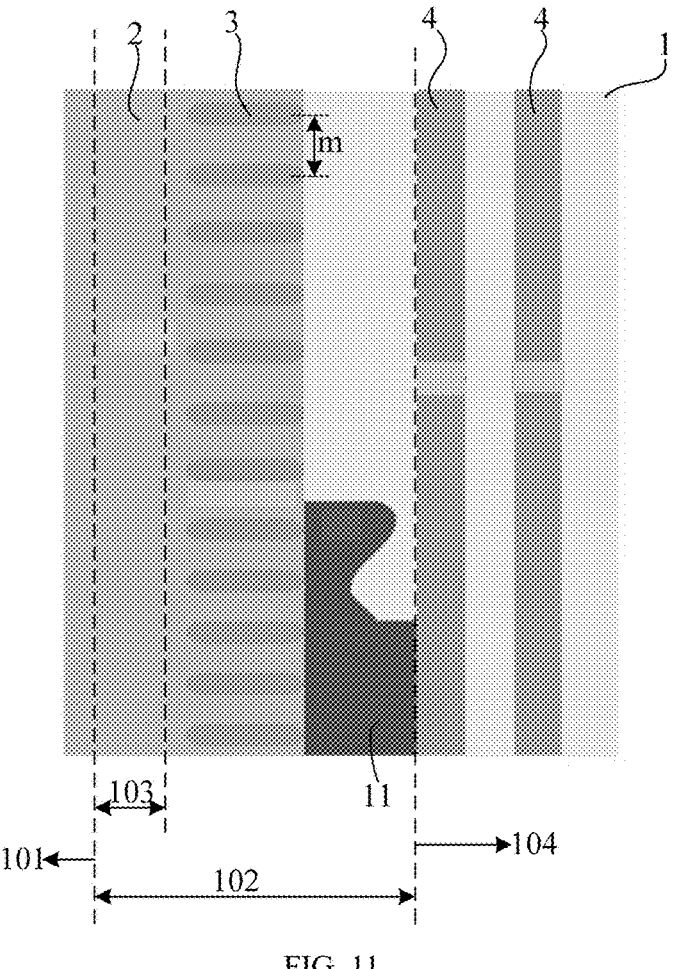
FIG. 11 is yet another schematic top view of a partial structure of an edge region of a display substrate according to an embodiment of the present disclosure.

In some embodiments, referring to FIG. 11, the concave parts include bar-shaped grooves, and a length direction of the bar-shaped groove forms an angle greater than 0° and less than or equal to 90° relative to an extending direction of the boundary of the planarization layer 2 where the bar-shaped grooves are located. By providing the bar-shaped grooves, when the organic packaging layer material ink 5 is printed in the display region 101 and the border edge region 103 later, the three-phase balance relationship between the organic packaging layer material ink 5 and the boundary of the planarization layer 2 can be more easily destroyed, and the organic packaging layer material ink 5 can be guided to a region in the first edge region 102 other than the border edge region 103, so that the organic packaging layer material ink 5 can be uniformly spread to the region in the first edge region 102 other than the border edge region 103 to further cover that region and fill holes in an edge end face of the conductive pattern (such as a VSS conductive pattern) in the first edge region 102. Therefore, the surface of the region in the first edge region 102 of the display substrate other than the border edge region 103 tends to be flat under the filling and leveling action of the organic packaging layer material ink 5.

Figure 12:
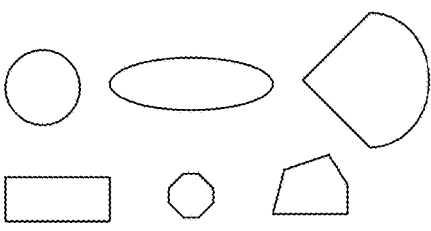
FIG. 12 is a schematic diagram showing shapes of orthographic projections of concave parts on a planarization layer according to an embodiment of the present disclosure.

In some embodiments, referring to FIG. 12, the concave parts include recessed holes, and a shape of an orthographic projection of the recessed hole on the planarization layer 2 includes a circular shape, an elliptical shape, a fan shape, a rectangular shape, a polygonal shape or an irregular shape.

Based on the above structure of the display substrate, the embodiment further provides a method for fabricating the display substrate as described above, including: fabricating a driver circuit board, including forming a plurality of functional film layers; forming a planarization layer on the driver circuit board; and forming a flow guide structure on the planarization layer. The flow guide structure is formed on at least one side of a boundary of the planarization layer on a side of the planarization layer facing away from the driver circuit board.

The flow guide structure is made of the same material as the planarization layer, such as a photoresist material or an organic resin material. The driver circuit board is formed through a conventional process, which is not described in detail here.

In some embodiments, forming the flow guide structure includes forming a convex part; and forming the convex part includes the following steps S01 to S02.

Step S01 includes: coating a planarization layer material film on the planarization layer.

In this step, the planarization layer is formed through film coating, exposure and development, and a planarization layer material film is coated on the formed planarization layer.

Step S02 includes: exposing and developing to form a pattern of the convex part.

In some embodiments, forming the convex part includes the following steps S01' to S02'.

Step S01' includes: performing, during formation of the planarization layer, halftone exposure on the planarization layer material film formed by coating, not exposing a region corresponding to the pattern of the convex part, partially exposing regions corresponding to a pattern of the planarization layer other than the region corresponding to the pattern of the convex part, and completely exposing regions other than the regions corresponding to the pattern of the convex part and the pattern of the planarization layer.

Step S02' includes: forming the pattern of the convex part and the pattern of the planarization layer simultaneously after development.

In some embodiments, forming the flow guide structure includes forming a concave part; and forming the concave part includes the following steps S01" to S02".

Step S01" includes: performing, during formation of the planarization layer, halftone exposure on the planarization layer material film formed by coating, partially exposing a region corresponding to a pattern of the concave part, not exposing regions corresponding to a pattern of the planarization layer other than the region corresponding to the pattern of the concave part, and completely exposing regions other than the region corresponding to the pattern of the planarization layer.

Step S02" includes: forming the pattern of the concave part and the pattern of the planarization layer simultaneously after development.

According to the display substrate in the embodiments, by providing the flow guide structure on at least one side of the boundary of the planarization layer, when the organic packaging layer material ink is printed in the display region and the border edge region later, the flow guide structure can destroy a three-phase balance relationship between the organic packaging layer material ink and the boundary of the planarization layer, and guide the organic packaging layer material ink to a region in the first edge region other than the border edge region, so that the organic packaging layer material ink can be uniformly spread to the region in the first edge region other than the border edge region to further cover that region and fill holes in an edge end face of the conductive pattern (such as a VSS conductive pattern) in the first edge region. Therefore, the surface of the region in the first edge region of the display substrate other than the border edge region tends to be flat under the filling and leveling action of the organic packaging layer material ink. Therefore, it is ensured that the inorganic packaging layer subsequently formed over the organic packaging layer has good compactness, and the failure of the inorganic packaging layer to package the light-emitting element is avoided. In addition, when a touch electrode film layer is formed over the packaging layer later, it is ensured that the touch electrode wire in the first edge region is on a relatively flat surface, thereby avoiding defects such as short circuit or open circuit of the touch electrode wire correspondingly distributed in the first edge region.

Figure 13:
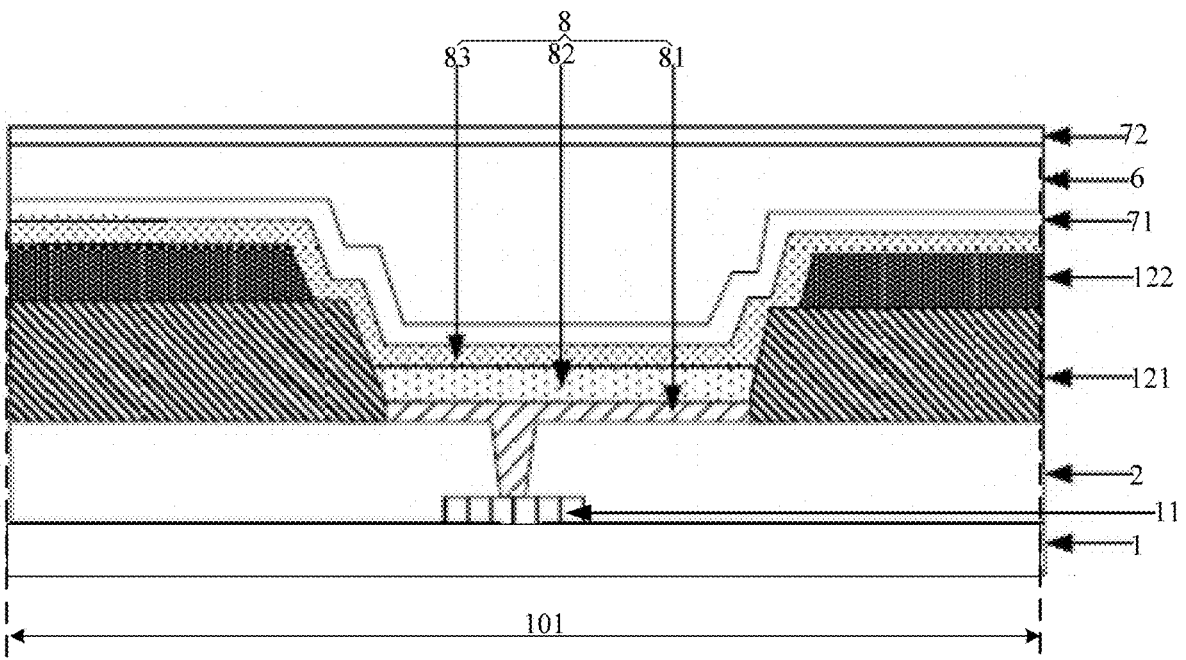
FIG. 13 is a schematic sectional view of a structure of a display region of a display panel according to an embodiment of the present disclosure.

An embodiment of the present disclosure further provides a display panel which, referring to FIG. 13, includes a light-emitting element 8 and an organic packaging layer 6, as well as the display substrate in any of the above embodiments. The light-emitting element 8 is disposed on a side of the planarization layer 2 facing away from the driver circuit board 1 in the display substrate, and in a display region 101 of the display substrate. The organic packaging layer 6 is disposed on a side of the light-emitting element 8 facing away from the planarization layer 2 to package the light-emitting element 8; and the organic packaging layer 6 extends from the display region 101 to cover the first edge region of the display substrate.

According to the display panel adopting the display substrate in any of the above embodiments, by providing the flow guide structure on the boundary of the planarization layer 2 in the display substrate, the organic packaging layer material ink for inkjet printing can be guided to the first edge region of the display substrate, so that the resulted organic packaging layer 6 extends from the display region 101 to cover the first edge region of the display substrate, and thus the surface of the first edge region tends to be flat. Therefore, it is ensured that the inorganic packaging layer subsequently formed over the organic packaging layer 6 has good compactness, and the failure of the inorganic packaging layer to package the light-emitting element 8 is avoided. In addition, when a touch electrode film layer is formed over the packaging layer later, it is ensured that the touch electrode wire in the first edge region is on a relatively flat surface, thereby avoiding defects such as short circuit or open circuit of the touch electrode wire correspondingly distributed in the first edge region.

In some embodiments, the light-emitting element 8 includes a first electrode 81, a light-emitting functional layer 82, and a second electrode 83 sequentially stacked. The light-emitting element 8 is located in a region defined by the pixel defining layer 121.

In some embodiments, a surface of the organic packaging layer 6 facing away from the light-emitting element 8 is a first surface; and a portion of the first surface in the display region 101 is substantially flush with a portion of the first surface in the first edge region.

In some embodiments, the display panel further includes a first inorganic packaging layer 71 and a second inorganic packaging layer 72. The first inorganic packaging layer 71 is located between the light-emitting element 8 and the organic packaging layer 6; the second inorganic packaging layer 72 is located on a side of the organic packaging layer 6 facing away from the light-emitting element 8; and the first inorganic packaging layer 71 and the second inorganic packaging layer 72 cover the display region 101, the first edge region, and the second edge region of the display substrate. The packaging region of the organic packaging layer 6 tends to be flat, so that it is ensured that the second inorganic packaging layer 72 formed on the organic packaging layer 6 has good compactness, and the light-emitting element 8 is prevented from being corroded by external water and oxygen. The organic packaging layer 6, located between the first inorganic packaging layer 71 and the second inorganic packaging layer 72, can further relieve a stress generated during deposition of the inorganic packaging layer.

In some embodiments, the display panel further includes a touch electrode layer on a side of the second inorganic packaging layer 72 facing away from the organic packaging layer 6, and the touch electrode layer extends from the display region 101 to the first edge region. The packaging region of the organic packaging layer 6 tends to be flat, so that it is ensured that a wire of the touch electrode layer in the first edge region is distributed on a relatively flat surface, and defects such as short circuit or open circuit of the touch electrode wire are avoided.

According to the display panel in the embodiments, by adopting the display substrate in any of the above embodiments and providing the flow guide structure on the boundary of the planarization layer in the display substrate, the organic packaging layer material ink for inkjet printing can be guided to the first edge region of the display substrate, so that the resulted organic packaging layer extends from the display region to cover the first edge region of the display substrate, and thus the surface of the first edge region tends to be flat. Therefore, it is ensured that the inorganic packaging layer subsequently formed over the organic packaging layer has good compactness, and the failure of the inorganic packaging layer to package the light-emitting element is avoided. In addition, when a touch electrode film layer is formed over the packaging layer later, it is ensured that the touch electrode wire in the first edge region is on a relatively flat surface, thereby avoiding defects such as short circuit or open circuit of the touch electrode wire correspondingly distributed in the first edge region.

An embodiment of the present disclosure further provides a display device, including the display panel in any of the above embodiments.

By adopting the display panel in any of the above embodiments, good packaging of the display device is guaranteed, and at the same time, good touch quality of the display device is ensured.

The display device in the embodiment of the present disclosure may be any product or component with a display function, such as an OLED panel, an OLED television, a monitor, a mobile phone, a navigator, or the like.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display substrate, comprising:
a driver circuit board comprising a plurality of functional film layers; and
a planarization layer on the driver circuit board;
wherein the display substrate comprises a display region and a first edge region surrounding a periphery of the display region;
part of the functional film layers extends from the display region to the first edge region; and
the planarization layer extends from the display region to an area of the first edge region that borders the display region; and
wherein the display substrate further comprises a flow guide structure on a side of the planarization layer facing away from the driver circuit board, and on at least one side of a boundary of the planarization layer, the flow guide structure comprises a plurality of concave parts disposed in the planarization layer, and a depth of the concave part is less than a thickness of the planarization layer.

2. The display substrate according to claim 1, wherein the flow guide structure comprises a plurality of convex parts arranged at intervals along the boundary of the planarization layer.

3. The display substrate according to claim 2, wherein the plurality of convex parts are arranged at equal intervals along the boundary of the planarization layer.

4. The display substrate according to claim 3, wherein an interval between adjacent convex parts ranges from 300 μm to 400 μm; and
a maximum radial size of an orthographic projection of the convex part on the planarization layer ranges from 15 μm to 30 μm.

5. The display substrate according to claim 2, wherein a shape of the convex part comprises a prismatic shape, a cylindrical shape, a frustum shape, or a prismoid shape, and a central axis of each convex part is perpendicular to a plane where the planarization layer is located.

6. The display substrate according to claim 1, wherein the plurality of concave parts are arranged at intervals along the boundary of the planarization layer.

7. The display substrate according to claim 6, wherein the plurality of concave parts are arranged at equal intervals along the boundary of the planarization layer.

8. The display substrate according to claim 7, wherein an interval between adjacent concave parts ranges from 300 μm to 400 μm; and
a maximum size of the concave parts in a direction perpendicular to an extending direction of an orthographic projection of the concave part on the planarization layer ranges from 15 μm to 30 μm.

9. The display substrate according to claim 6, wherein the concave parts comprise bar-shaped grooves or recessed holes;
a length direction of the bar-shaped groove forms an angle greater than 0° and less than or equal to 90° relative to an extending direction of the boundary of the planarization layer where the bar-shaped grooves are located; and
a shape of an orthographic projection of the recessed hole on the planarization layer comprises a circular shape, an elliptical shape, a fan shape, a rectangular shape, a polygonal shape or an irregular shape.

10. The display substrate according to claim 1, further comprising a second edge region surrounding a periphery of the first edge region;
wherein the driver circuit board further comprises a plurality of insulating film layers extending from the display region to the first edge region and the second edge region; and
in the second edge region, a dam surrounding the display region is formed in one or more of the insulating film layers adjacent to the planarization layer.

11. A display panel, comprising a light-emitting element and an organic packaging layer, wherein the display panel further comprises the display substrate according to claim 1;
the light-emitting element is disposed on a side of the planarization layer facing away from the driver circuit board in the display substrate, and in the display region of the display substrate;
the organic packaging layer is disposed on a side of the light-emitting element facing away from the planarization layer to package the light-emitting element; and
the organic packaging layer extends from the display region to cover the first edge region of the display substrate.

12. The display panel according to claim 11, wherein a surface of the organic packaging layer facing away from the light-emitting element is a first surface; and
a portion of the first surface in the display region is substantially flush with a portion of the first surface in the first edge region.

13. The display panel according to claim 11, further comprising a first inorganic packaging layer and a second inorganic packaging layer;

the first inorganic packaging layer is located between the light-emitting element and the organic packaging layer;

the second inorganic packaging layer is located on a side of the organic packaging layer facing away from the light-emitting element; and the first inorganic packaging layer and the second inorganic packaging layer cover the display region, the first edge region, and a second edge region of the display substrate.

14. The display panel according to claim 13, further comprising a touch electrode layer on a side of the second inorganic packaging layer facing away from the organic packaging layer;

wherein the touch electrode layer extends from the display region to the first edge region.

15. A display device, comprising the display panel according to claim 11.

16. A method for fabricating a display substrate, wherein the display substrate is the display substrate according to claim 1, and the method comprises:

fabricating a driver circuit board, comprising forming a plurality of functional film layers; and forming a planarization layer on the driver circuit board;

wherein the method further comprises forming a flow guide structure on the planarization layer; and the flow guide structure is formed on at least one side of a boundary of the planarization layer on a side of the planarization layer facing away from the driver circuit board.

17. The method according to claim 16, wherein forming the flow guide structure comprises forming a convex part; forming the convex part comprises:

coating a planarization layer material film on the planarization layer; and exposing and developing to form a pattern of the convex part; or forming the convex part comprises:

performing, during formation of the planarization layer, halftone exposure on a planarization layer material film formed by coating, such that a region corresponding to the pattern of the convex part is not exposed, a region corresponding to a pattern of the planarization layer other than the region corresponding to the pattern of the convex part is partially exposed, and regions other than the regions corresponding to the pattern of the convex part and the pattern of the planarization layer are completely exposed; and forming the pattern of the convex part and the pattern of the planarization layer simultaneously after development.

18. The method according to claim 16, wherein forming the flow guide structure comprises forming a concave part; and forming the concave part comprises:

performing, during formation of the planarization layer, halftone exposure on a planarization layer material film formed by coating, such that a region corresponding to a pattern of the concave part is partially exposed, a region corresponding to a pattern of the planarization layer other than the region corresponding to the pattern of the concave part is not exposed, and regions other than the region corresponding to the pattern of the planarization layer are completely exposed; and forming the pattern of the concave part and the pattern of the planarization layer simultaneously after development.

* * * * *